US006183358B1

United States Patent
Adair, Jr.

(10) Patent No.: US 6,183,358 B1
(45) Date of Patent: Feb. 6, 2001

(54) ISOLATED MULTILEVEL FABRICATING FACILITY WITH TWO WAY CLEAN TUNNEL TRANSPORT SYSTEM WITH EACH TOOL HAVING ADJACENT SUPPORT SKID

(75) Inventor: Robert M. Adair, Jr., Lucas, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/189,290

(22) Filed: Nov. 10, 1998

Related U.S. Application Data

(60) Provisional application No. 60/065,838, filed on Nov. 17, 1997.

(51) Int. Cl.⁷ .................................................. B05C 5/00
(52) U.S. Cl. ...................... 454/187; 198/346.1; 414/940
(58) Field of Search ...................... 454/187; 198/346.1; 55/385.2, 487, DIG. 18; 901/7, 935; 414/935, 937, 938, 940

(56) References Cited

U.S. PATENT DOCUMENTS

| | | | |
|---|---|---|---|
| 4,805,759 | * 2/1989 | Rochet et al. | ..................... 198/346.1 |
| 4,926,753 | * 5/1990 | Weiss | ..................... 104/88 |
| 5,487,768 | * 1/1996 | Zytka et al. | ......................... 55/385.2 |
| 5,725,664 | * 3/1998 | Nambu et al. | .......................... 118/52 |
| 5,833,726 | * 11/1998 | Kinkead et al. | ....................... 55/356 |

* cited by examiner

Primary Examiner—Harold Joyce
(74) Attorney, Agent, or Firm—Wade James Brady III; Frederick J. Telecky, Jr.

(57) ABSTRACT

An ultra-clean environment for fabrication of semiconductor devices which includes an air transmissive conveyor for conveying semiconductor wafers thereon and a plurality of robotic elements. A clean channel encloses the conveyor. The clean channel includes a filtered air intake extending from one surface of the conveyor and an air exhaust region extending in a direction opposite the air intake. The robotic elements is disposed external to and communicating with the clean channel. Laminar flow of filtered air is provided from the air intake to the air exhaust. The conveyor preferably traverses a serpentine path. The path of the conveyor is substantially bi-directional in that it travels in a first direction in then in the opposite direction immediately adjacent the portion traveling in the first direction. Robotic elements are disposed external to the clean channel, communicate with the clean channel and are at a reduced pressure relative to the clean channel. A plurality of said conveyors can be disposed within the clean channel, preferably stacked one floor atop the other. Each tool has its support skid immediately adjacent to the tool it serves.

12 Claims, 3 Drawing Sheets

ISOLATED MULTILEVEL FABRICATING FACILITY WITH TWO WAY CLEAN TUNNEL TRANSPORT SYSTEM WITH EACH TOOL HAVING ADJACENT SUPPORT SKID

This application claims priority under 35 USC 119(e)(1) of provisional application Ser. No. 60/065,838 filed Nov. 17, 1997.

BACKGROUND OF THE INVENTION

1. Field of the Invention

This invention relates to a semiconductor fabrication facility and, more specifically, to such a facility which requires reduced clean room area, less cumbersome working conditions for the operators and reduced ultimate fabrication costs.

2. Brief Description of the Prior Art

Semiconductor fabrication facilities generally require that all process steps wherein the semiconductor wafer can be exposed to external contaminants be conducted in a "clean" atmosphere to avoid or at least minimize the likelihood that such contaminants ultimately reside on the wafer itself The degree of cleanliness required has become more acute as the dimensions of the components on the wafer decreased with time because this decrease in dimensions enables continually smaller contaminants to be capable of causing irreparable damage to the semiconductor devices being fabricated. In order to provide the required degree of cleanliness, it has been necessary to enclose the processing equipment in "clean" rooms with the degree of cleanliness being required to meet certain specified standards as is well known in the art. The fabrication tools are located throughout the "clean" room and operators wearing special garments are required to transport batches of semiconductor wafers from fabrication tool to fabrication tool within the "clean" rooms up to encapsulation of the device at which time the device can be removed from the "clean" room since it is no longer subject to possible contamination. Each fabrication tool has its own support skid attached thereto which includes items such as RF power supplies, vacuum pumps, gas cylinders, etc. These clean rooms require specified air circulation and filtering as well as zones above and below the "clean" room floor and ceiling for additional cleanliness protection, this requiring essentially three floors. Also, the personnel within the clean room are required to wear special gowns to further avoid introduction of contaminants into the "clean" room. These requirements include the use of a great deal of space for the equipment and operators, provide cumbersome working conditions for the operators in that special garments must be worn and require significant cost to maintain the large "clean" room ambient volume at the required level of cleanliness. Typical prior art semiconductor fabrication facilities are discussed in the U.S. Pat. No. 5,344,365.

SUMMARY OF THE INVENTION

In accordance with the present invention, the above described problems of the prior art are minimized and there is provided a semiconductor fabrication facility which substantially minimizes the clean room volume and permits the operators to function either entirely or to a minimal degree out of the "clean" room environment, thereby minimizing the cost of maintaining the "clean" room conditions and permitting the facility operators to function without wearing special garments which may be cumbersome and undesirable and a possible impediment to operation of the facility.

Briefly, the above is accomplished by providing a bi-directional continually recirculating conveyor wherein the wafers travel along one side of the conveyor from a point of entry to the end of the conveyor and then return toward and possibly up to the point of entry along an opposing side of the conveyor. Only the region or corridor occupied by the conveyor requires "clean" room conditions with operators able to be located out of the "clean" room region and capable of operation on the wafers traveling along the conveyor by robotics and the like without entry into the clean room area. This permits the operators to wear standard clothing to suit the conditions and to be capable of operating without impediment resulting from the garment being worn. Tools are positioned along both sides of the conveyor so that operations can be performed on the wafers during both forward and reverse travel directions along the conveyor to conserve space. The conveyor preferably takes a serpentine shape to permit such disposition of tools on both sides of the conveyor while minimizing the total area requirement of the conveyor to a relatively compact area.

The "clean" room or, more accurately "clean corridor" conditions are provided by enclosing only the conveyor and the region thereabove and therebelow, preferably down to the room floor. Fresh air enters the top of the enclosed region, preferably at spaced points along the enclosed region, and is forced by fans through a filter of required type to remove contaminants. The filtered air then passes through the conveyor, which is preferably an air transmissive belt or the like, such as, for example, a perforated belt, whereby the filtered air can pass through the conveyor to the "clean" corridor region below the belt and pass out into the ambient atmosphere external of the "clean" corridor region. Since there is a pressure above the ambient pressure within the "clean" corridor region, the filtered air will be forced out of the "clean" corridor region by the pressure within the "clean" corridor region. This results in a constant recirculation of filtered air through the "clean" corridor region with the "clean" corridor being disposed on a single floor level rather than the three floor levels required by the prior art.

In operation, a load of wafers is placed into the system at one end of the conveyor within the "clean" corridor region and the recipe for fabrication of devices on that wafer can be entered into the system to determine the operations to be performed on the wafer during its travel along the conveyor. The wafer are then transported along the conveyor from station to station whereat the programmed operations are performed on the wafers either by machine robot and/or by human operator, if required, either on the conveyor or by removing the wafer from the conveyor to a tool which maintains "clean" corridor condition, whereat an operation is performed on the wafer with the wafer then being returned to the conveyor for transport to the next operation. The wafers continue along the conveyor to the end of the conveyor and then return along an adjacent path of the conveyor but in the opposite direction while further processing operations are performed on the wafer during its travel in the opposite direction. When the wafer returns to the original point of entry into the "clean" corridor environment or some other point in its travel path on the conveyor, the processing will be completed to the extent that "clean" corridor conditions are no longer required. At this point, the wafer or devices formed from the wafer can be removed from the conveyor for final operation thereon, if required.

It can be seen that the entire fabrication facility is provided using minimum floor area with the required "clean" corridor region being minimized to cover only the area covered by the fabrication equipment and a region thereabove and therebelow. Operators can operate within the "clean" corridor region without entry into the "clean" corridor region, thereby eliminating the requirement of wearing special garments or the like. In general, the operators required only for placement of virgin wafers into the system and for removal of processed wafers and/or devices from the system.

As a further embodiment of the invention, a plurality of conveyors systems can be installed on additional floors. This multi-floor installation allows each floor to operate independently from the others. In other words, an interruption on one floor does not interrupt production on the other floors. This is a risk reduction factor.

DESCRIPTION OF THE PREFERRED EMBODIMENT

Figure 1:
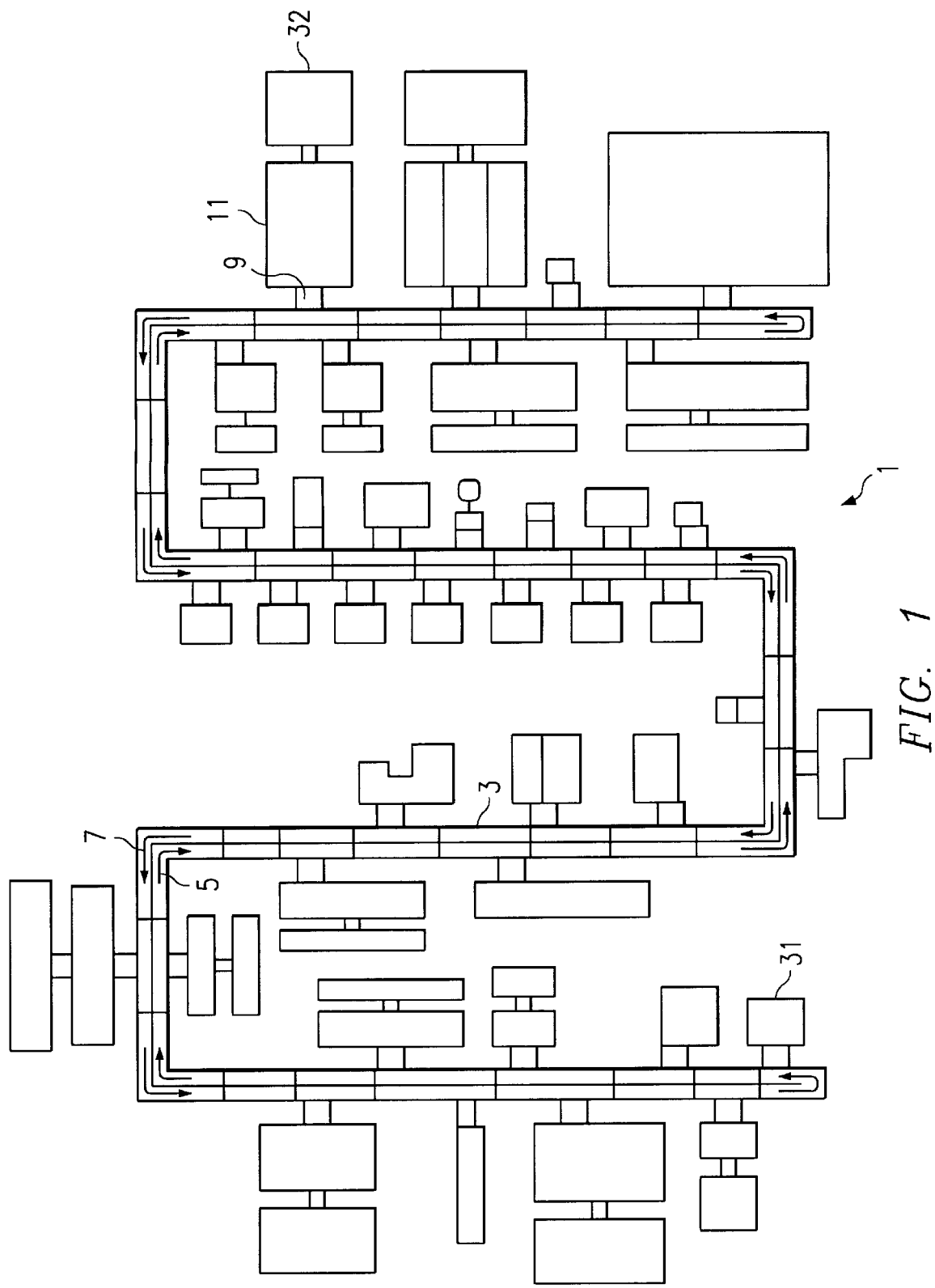
FIG. 1 is a top view of a conveyor system in accordance with the present invention with the "clean" corridor region not shown.

Referring to FIG. 1, there is shown a conveyor system in accordance with the present invention with the "clean" corridor portion omitted. The conveyor 1 is serpentine in nature and is shown in rectangular form, though it can also be curved at the corner regions. The conveyor 1 includes an air transmissive transport belt 3, preferably a perforated belt, which transports wafers placed thereon in a forward direction to the end of the conveyor along a path 5 and then in a reverse direction to the other end of the conveyor along a path 7. Robotic interfaces 9 are positioned at various locations along both paths of the transport belt and on both sides of the conveyor system. The robotic interfaces are well known and can either process wafers disposed on the transport belt 3 or can remove the wafers from the transport belt for processing in a tool 11 with return of the wafer to the transport belt after processing with the tool is complete. Processing, as is well known, can include mechanical as well as chemical operations. In FIG. 1, support skid 32 contains the equipment necessary for the specific tool to function, i.e., vacuum pumps, power supplies, RF units, refrigeration units, etc. as is well known in the art.

Figure 2:
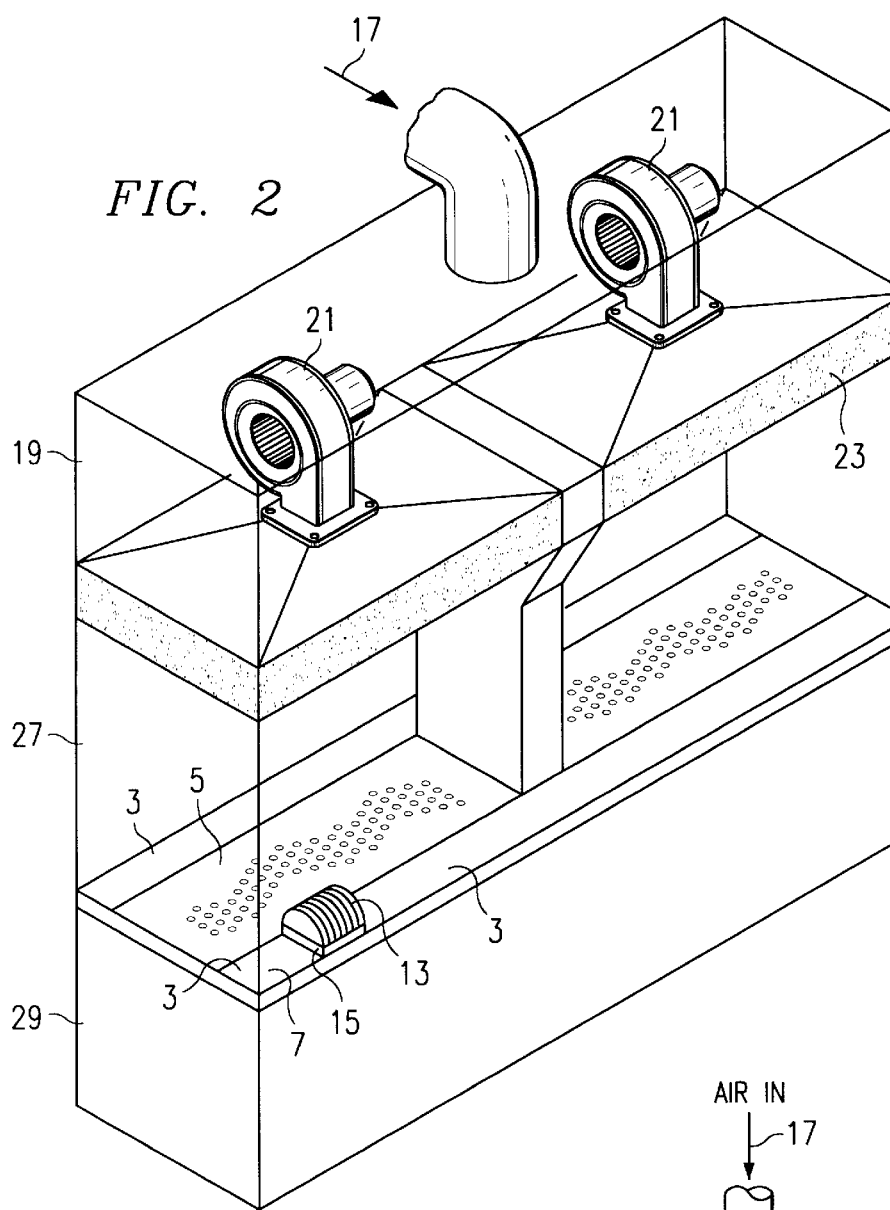
FIG. 2 is an elevational view of a portion of the conveyor system of FIG. 1 with the "clean" corridor provided immediately thereabove and therebelow.

Referring to FIG. 2, only the conveyor system 1 is provided with a "clean" corridor with the region to the sides of the conveyor system being external to the "clean" region and therefore being the ambient environment. The transport belt 3 includes the first portion 5 which transports wafers 13 on a wafer holder 15 in a forward direction and the second portion 7 which transports wafer on a wafer holder in a reverse direction within the "clean" corridor 27. Fresh air 17 from the ambient, which can be temperature and humidity modified either before entry into the "clean" corridor 27 or within the "clean" corridor 27, is passed into a chamber 19 above the "clean" air corridor and forced under pressure provided by fans 21 through an appropriate filter 23 into the "clean" corridor. The filtered clean air then passes through the air transmissive transport belt 3 and exits from the region 29 below the conveyor system 1 due to the elevated pressure of the air within the "clean" corridor 27.

Figure 3:
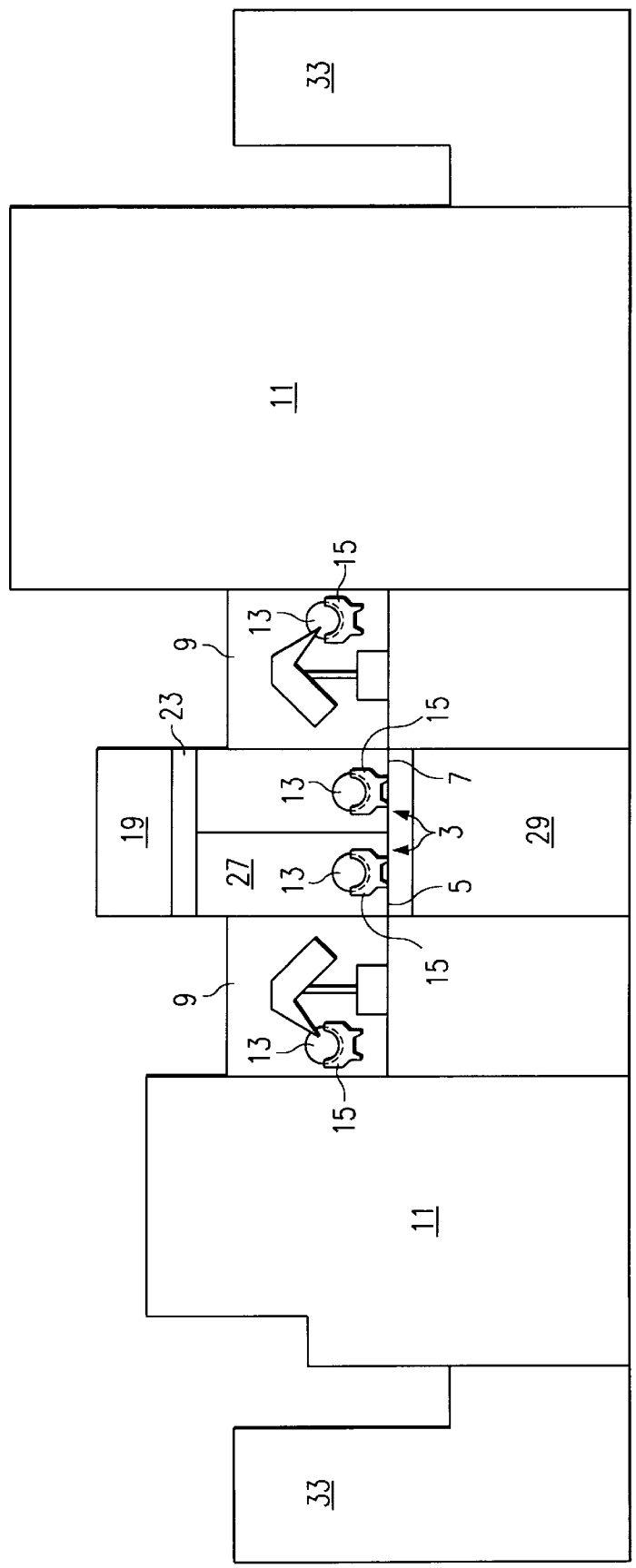
FIG. 3 is a cross-sectional view of the conveyor system of FIG. 1 with the "clean" corridor of FIG. 2 showing robotic equipment for processing wafers from the conveyor system and the process tools support skid.

Referring to FIG. 3, there is shown the belt 3 with paths 5 and 7 of the conveyor system 1 with a wafer holder 15 having wafers 13 therein along each path. Also shown is the chamber 19, "clean" corridor 27 and air exit region 29. The robot interface 9 is positioned adjacent the "clean" corridor 27 and is capable of removing a wafer 13 from the wafer holder 15 and placing the wafer in the tool for operation thereon and then returning the wafer to the belt 3 when the operation within the tool has been completed. As can be seen, plural robot interfaces 9 and tools 11 can be placed on both sides of the conveyor system 1 to operate on wafers 13 traveling along either of the paths 5 and 7. The air pressure within said "clean" corridor is always greater than the air pressure surrounding said robot interface 9 and said tool 11 so that exhaust can also be provided through said robotic interface and/or said tool. Support skid 33 in FIG. 3 shows the relationship between the process tool and its support skid.

In operation, virgin wafers 13 in wafer holders 15 are placed on the transport belt 3, such as at position 31 in FIG. 1, and transported along the paths 3 and 5. Also, the system is set by software to process the wafers according to a predetermined process flow which controls each of the robotic interfaces as well as the tools associated with the robotic interfaces, neither of which form a part of this invention and both of which are well known in the art. The wafers 13 and transport belt 3 travel around the conveyor system 1 and are withdrawn from the belt 3 in accordance with the programmed operations for processing until the wafers reach the end of the belt or are withdrawn at some point prior to the end of the belt on the return trip. The withdrawn articles can be processed wafers ready for further operation thereon or partially and/or completely fabricated and/or tested semiconductor devices derived from the wafer. At all times, operation takes place within the "clean" corridor with operators having access to the system at all times from a position external to the "clean" corridor without requiring entry into the "clean" corridor.

Figure 4:
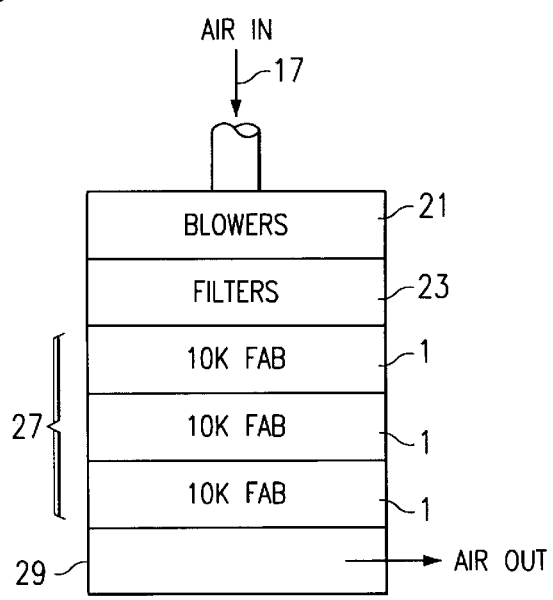
FIG. 4 is a schematic diagram of the positioning of plural conveyor systems, one floor atop the other, each floor being independent of the other floors.

Referring to FIG. 4, there is shown a further embodiment in accordance with the present invention wherein a plurality of conveyor systems 1 of the type shown in FIG. 1 are stacked, one floor atop the other. The stacked floors, each floor having conveyor systems 1, contain a single "clean" corridor 27 of the type shown in FIGS. 2 and 3 with all other structure being identical except for the duplication of the conveyor systems with stacking.

Referring again to FIG. 4, the embodiment as described above has a fire wall separating that system from the conveyor above or below. In addition, a separate air flow duct is provided from the filter 23 to each of the conveyor systems 1 with a separate air exit being provided for each conveyor system. In addition, each conveyor system 1 is hermetically sealed from the other conveyor systems. In this way, while each of the conveyor system is provided with a laminar flow of air therethrough, the flow of air to each system is separate and distinct from the flow of air to the other conveyor systems and the exhaust of air is also separate and distinct. In this way, should there be some problem which would cause contamination in one of the conveyor systems 1, such as, for example, a fire, the other conveyor systems could continue to operate independently without contamination from the floor with the problem.

Though the invention has been described with respect to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. An ultra-clean environment for fabrication of semiconductor devices which comprises:
   (a) a conveyor for conveying semiconductor wafers thereon, said conveyor is air transmissive;
   (b) a plurality of robotic elements;
   (c) a clean channel enclosing said conveyor, said clean channel including a filtered air intake extending from one surface of said clean channel conveyor and an air exhaust region extending in a direction opposite said air intake, said robotic elements being disposed external to and communicating with said clean channel and disposed in a region of reduced pressure relative to said clean channel; and
   (d) a laminar flow structure providing a laminar flow of filtered air from said air intake to said air exhaust.

2. The environment of claim 1 wherein at least a portion of said air flow is through said conveyor.

3. The environment of claim 1 wherein said conveyor traverses a serpentine path.

4. The environment of claim 1 wherein said conveyor traverses a serpentine path.

5. The environment of claim 2 wherein said conveyor traverses a serpentine path.

6. The environment of claim 1 wherein said conveyor traverses a substantially bi-directional path.

7. The environment of claim 6 wherein said conveyor traverses a substantially bi-directional path.

8. The environment of claim 1 further including a plurality of said conveyors within said clean channel.

9. The environment of claim 8 wherein said conveyors are stacked one atop the other.

10. The environment of claim 1 further wherein the air pressure within said clean channel is greater than the air pressure external to said clean channel and wherein said robotic elements are manually operable from a location external to said clean channel.

11. An ultra-clean environment for fabrication of semiconductor devices which comprises:
    (a) a conveyor for conveying semiconductor wafers thereon, said conveyor in an transmissive;
    (b) a plurality of robotic elements;
    (c) a clean channel enclosing said conveyor, said clean channel including a filtered air intake extending from one surface of said clean channel and an air exhaust region extending in a direction opposite said air intake, said robotic elements being disposed external to and communicating with said clean channel and disposed in a region of reduced pressure relative to said clean channel; and
    (d) a laminar flow structure providing a laminar flow of filtered air from said air intake to said air exhaust;
    (e) the air pressure within said clean channel being greater than the air pressure external to said clean channel.

12. An ultra-clean environment for fabrication of semiconductor devices which comprises:
    (a) a conveyor for conveying semiconductor wafers thereon, said conveyor is an transmissive;
    (b) a plurality of robotic elements;
    (c) a clean channel enclosing said conveyor, said clean channel including a filtered air intake extending from one surface of said clean channel and an air exhaust region extending in a direction opposite said air intake, said robotic elements being disposed external to and communicating with said clean channel and disposed in a region of reduced pressure relative to said clean channel; and
    (d) a laminar flow structure providing a laminar flow of filtered air from said air intake to said air exhaust;
    (e) said robotic elements being manually operable from a location external to said clean channel.

* * * * *